United States Patent
Acharya et al.

(10) Patent No.: US 8,743,523 B2
(45) Date of Patent: Jun. 3, 2014

(54) SYSTEMS, METHODS, AND APPARATUS FOR LIMITING VOLTAGE ACROSS A SWITCH

(75) Inventors: Parag Vishwanath Acharya, Madhapur (IN); Vijay Sukumar Magdum, Madhapur (IN)

(73) Assignee: General Electric Company, Schenectady, NY (US)

( * ) Notice: Subject to any disclaimer, the term of this patent is extended or adjusted under 35 U.S.C. 154(b) by 943 days.

(21) Appl. No.: 12/845,098

(22) Filed: Jul. 28, 2010

(65) Prior Publication Data

US 2012/0026632 A1 Feb. 2, 2012

(51) Int. Cl.
*H02H 3/20* (2006.01)

(52) U.S. Cl.
USPC .............................. 361/91.1; 361/56; 361/111

(58) Field of Classification Search
None
See application file for complete search history.

(56) References Cited

U.S. PATENT DOCUMENTS

| | | | |
|---|---|---|---|
| 3,736,480 A * | 5/1973 | Lee | 318/51 |
| 4,178,619 A * | 12/1979 | Seiler et al. | 361/91.6 |
| 4,270,159 A * | 5/1981 | Buckle | 361/79 |
| 4,658,203 A | 4/1987 | Freymuth | |
| 5,091,817 A | 2/1992 | Alley et al. | |
| 5,107,144 A | 4/1992 | Hirayama | |
| 5,309,344 A | 5/1994 | Smith | |
| 5,379,177 A | 1/1995 | Bird | |
| 5,495,198 A | 2/1996 | Chen | |
| 5,786,972 A | 7/1998 | Galipeau et al. | |
| 5,805,434 A | 9/1998 | Vinciarelli et al. | |
| 6,088,247 A | 7/2000 | Cheng | |
| 6,137,667 A | 10/2000 | Sieben et al. | |
| 6,281,735 B1 | 8/2001 | Page | |
| 6,304,475 B1 | 10/2001 | Iwata et al. | |
| 6,385,028 B1 * | 5/2002 | Kouno | 361/111 |
| 6,538,866 B1 | 3/2003 | Hanzawa et al. | |
| 6,882,548 B1 | 4/2005 | Jacobs et al. | |
| 6,897,703 B2 | 5/2005 | Hunt | |
| 6,987,378 B1 | 1/2006 | Steele | |
| 7,035,070 B2 | 4/2006 | Shiner et al. | |
| 7,078,882 B2 | 7/2006 | Weng et al. | |
| 7,091,705 B2 | 8/2006 | Hoshino et al. | |

(Continued)

FOREIGN PATENT DOCUMENTS

| | | |
|---|---|---|
| EP | 0550554 | 7/1993 |
| JP | 05276650 A | 10/1993 |
| JP | 2000232771 A | 8/2000 |

OTHER PUBLICATIONS

Search Report and Written Opinion for European Application No. 11174094.0 dated Sep. 5, 2012.

*Primary Examiner* — Jared Fureman
*Assistant Examiner* — Terrence Willoughby
(74) *Attorney, Agent, or Firm* — Sutherland Asbill & Brennan LLP

(57) ABSTRACT

Systems, methods, and apparatus for limiting voltage across a switch utilizing voltage clamping circuitry are provided. The voltage clamping circuitry may include a rectifier circuit comprising inputs and outputs, the inputs in parallel communication across operational circuitry; an electronic active switching device in parallel communication with the outputs of the rectifier circuit; and at least one Zener diode in parallel communication with the electronic active switching device. When voltage across the electronic active switching device and the Zener diode meets or exceeds a predetermined value, the current will flow through the electronic active switching device and limit voltage across the operational circuitry to within a voltage clamping circuitry voltage limit.

21 Claims, 8 Drawing Sheets

(56) References Cited

U.S. PATENT DOCUMENTS

| | | |
|---|---|---|
| 7,133,300 B1 | 11/2006 | Yang |
| 7,274,543 B2 | 9/2007 | Nishikawa et al. |
| 7,378,827 B2 | 5/2008 | Stoichita |
| 7,397,279 B2 | 7/2008 | Bhattacharya et al. |
| 7,518,430 B2 | 4/2009 | Dequina et al. |
| 7,558,036 B2 * | 7/2009 | Wardzala ............ 361/91.1 |
| 2002/0021575 A1 | 2/2002 | Yasumura |
| 2002/0057540 A1 | 5/2002 | Ito et al. |
| 2002/0075612 A1 | 6/2002 | Klaassen |
| 2003/0076642 A1 | 4/2003 | Shiner et al. |
| 2004/0150929 A1 * | 8/2004 | Strayer et al. ........... 361/91.1 |
| 2005/0047048 A1 | 3/2005 | Chin et al. |
| 2006/0152873 A1 | 7/2006 | Shiner et al. |
| 2007/0247880 A1 | 10/2007 | Kwon et al. |
| 2007/0279813 A1 | 12/2007 | Covi et al. |
| 2007/0285861 A1 | 12/2007 | Kim |
| 2008/0012542 A1 | 1/2008 | Liu et al. |
| 2008/0074909 A1 | 3/2008 | Mehta |
| 2008/0079533 A1 | 4/2008 | Liu et al. |
| 2008/0158758 A1 | 7/2008 | Salovaara et al. |
| 2008/0192396 A1 | 8/2008 | Zhou et al. |
| 2008/0247105 A1 | 10/2008 | Divan |
| 2009/0034139 A1 | 2/2009 | Martin |
| 2009/0059456 A1 | 3/2009 | Hou |
| 2009/0085633 A1 | 4/2009 | Ting |
| 2009/0097279 A1 | 4/2009 | Zhang et al. |
| 2009/0110117 A1 | 4/2009 | Chon et al. |
| 2009/0116158 A1 | 5/2009 | Graves et al. |
| 2010/0237805 A1 * | 9/2010 | Yamazaki et al. ........... 315/309 |

* cited by examiner

SYSTEMS, METHODS, AND APPARATUS FOR LIMITING VOLTAGE ACROSS A SWITCH

FIELD OF THE INVENTION

Embodiments of the invention relate generally to electronic circuitry, and more specifically relate to systems, methods, and apparatus for limiting voltage across a switch.

BACKGROUND OF THE INVENTION

When a switch switches off the alternating current (AC) or direct current (DC) power to an inductive load, no current flows through the switch and the voltage across the switch can rise to significant levels, as a result of voltage generated by the inductive load. Circuitry components may, therefore, be susceptible to damage if not protected from overvoltage.

It is, therefore, desirable to provide systems, methods, and apparatus for limiting voltage across a switch.

BRIEF DESCRIPTION OF THE INVENTION

Embodiments of the invention can address some or all of the needs addressed above. According to one embodiment, a voltage clamping electronic circuit device is provided. The device may include switching circuitry operable for selectively switching current from a power supply to an inductive load and voltage clamping circuitry in parallel communication with the switching circuitry. The voltage clamping circuitry may include a rectifier circuit comprising inputs and outputs, the inputs in parallel communication across the switching circuitry; an electronic active switching device in parallel communication with the outputs of the rectifier circuit; and at least one Zener diode in parallel communication with the electronic active switching device. When the switching circuitry is in open connection and voltage across the switching circuitry, the electronic active switching device, and the Zener diode meets or exceeds a predetermined value, the current will flow through the electronic active switching device and limit voltage across the switching circuitry to within a voltage clamping circuitry voltage limit.

According to another embodiment, a method for limiting voltage across a switch is provided. The method may include: providing switching circuitry operable for selectively switching current from a power supply to an inductive load; providing voltage clamping circuitry in parallel communication with the switching circuitry; opening the switching circuitry preventing the current from flowing from the power supply to the inductive load; rectifying the current with a rectifier circuit; and limiting the voltage across the switching circuitry to within a voltage clamping circuitry limit with an electronic active switching device in parallel communication with the outputs of the rectifier circuit and at least one Zener diode in parallel communication with the electronic active switching device. When the switching circuitry is in open connection and voltage across the switching circuitry, the electronic active switching device, and the Zener diode meets or exceeds a predetermined value, the current will flow through the electronic active switching device and limit voltage across the switching circuitry to within the voltage clamping limit.

According to yet another embodiment, voltage clamping circuitry is provided. The voltage clamping circuitry may include a rectifier circuit comprising inputs and outputs, the inputs in parallel communication across operational circuitry; an electronic active switching device in parallel communication with the outputs of the rectifier circuit; and at least one Zener diode in parallel communication with the electronic active switching device. When voltage across the electronic active switching device and the Zener diode meets or exceeds a predetermined value, the current will flow through the electronic active switching device and limit voltage across the operational circuitry to within a voltage clamping circuitry voltage limit.

Other embodiments, aspects, and features will become apparent to those skilled in the art from the following detailed description, the accompanying drawings, and the appended claims.

BRIEF DESCRIPTION OF THE DRAWINGS

Reference will now be made to the accompanying drawings, which are not necessarily drawn to scale, and wherein.

DETAILED DESCRIPTION OF THE INVENTION

Figure 1:
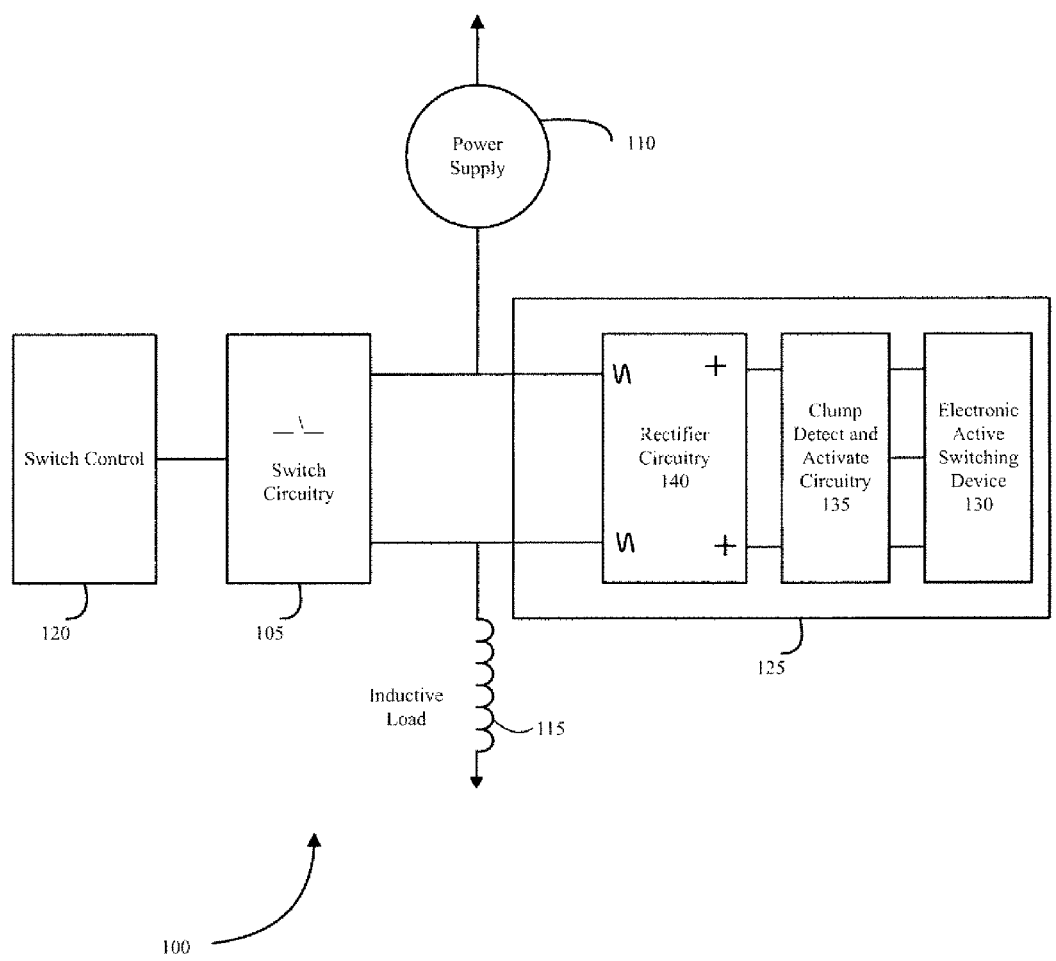
FIG. 1 is a functional diagram representation of switch circuitry and voltage clamping circuitry, according to one example embodiment.

Illustrative embodiments of the invention now will be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

Embodiments of the systems and methods described herein provide systems, methods, and apparatus for limiting voltage across a switch, in particular, switch circuitry utilizing voltage clamping circuitry. To avoid damaging circuitry components when a switch delivering power to an inductive load is opened, voltage is clamped to avoid or suppress voltage spikes resulting from an inductive voltage build-up in the inductive load after the switch is opened. Voltage clamping circuitry embodiments provide bi-directional voltage clamping for use with DC or AC power sources.

Conventional clamping circuitry utilizes metal oxide varistor (MOV) devices, Zener diode only circuits, or snubber circuits. A MOV device may not be desirable in many instances because the working voltage of the MOV and the clamping voltage have a large enough gap between the two. MOV devices, because of the typical large gap between working voltages and large clamping voltages, would typically also require switch devices that handle high voltages, which are undesirably expensive. In addition, MOV devices typically require replacement after dissipating a certain amount of energy. Zener diode only circuits, such as shunt regulators, typically cannot handle such high energies as can be handled by the voltage clamping circuitry embodiments described herein and as needed for the switching circuitry and the inductive loads to be powered. Similarly, snubber circuits or devices typically have a high cost associated with them, in addition to undesirable circuit complexity. Moreover, snubber circuits often generate a small leakage when a switch is in an open state.

Accordingly, various embodiments of the invention described herein include voltage clamping circuitry in parallel communication with switch circuitry. According to one embodiment, the voltage clamping circuitry includes: a rectifier circuit, an electronic active switching device in parallel communication with the rectifier circuit, and at least one diode, such as, but not limited to, a Zener diode, in communication with the electronic active switching device. The rectifier circuit allows handling bi-directional current with a single clamping circuit. The electronic active switching device can selectively dissipate the energy at the desired levels. According to various embodiments, the electronic active switching device may be, but is not limited to, a metal-oxide-semiconductor field-effect transistor (MOSFET), a bipolar junction transistor (BJT), a Darlington pair transistor, an insulated gate bipolar transistor (IGBT), and the like.

As described in more detail herein, additional circuitry components may be included. For example, one or more additional diodes, such as Zener diodes, may be utilized to alter the voltage at which the electronic active switching device is activated and begins to dissipate energy. It is possible that switches can be utilized in parallel with the one or more additional diodes, which allow for selectively adjusting the clamping voltage by switching current through the respective switched diode. In addition, one or more variable resistive devices may be included to selectively adjust or limit current flowing through the electronic active switching device.

FIG. 1 illustrates a functional diagram representation of simplified switch circuitry and voltage clamping circuitry, according to one example embodiment. According to this embodiment, an example system 100 (e.g., the combined circuitry components) includes switch circuitry 105, a power supply 110, and an inductive load 115. The switch circuitry 105 may be controlled by a switch control 120 according to any means (e.g., electronic, mechanical, electromechanical, processor-based controller, etc.). The switch circuitry 105 is further in parallel communication with voltage clamping circuitry 125, which includes an electronic active switching device 130, clamp detect and activate circuitry 135, and, optionally, rectifier circuitry 140. Additional details regarding each of these components are provided with reference to the example embodiments illustrated by FIGS. 2-8.

It is further appreciated that, according to other embodiments, instead of, or in addition to, switch circuitry, a power supply, and/or an inductive load, various other operational circuitry may utilize the voltage clamping circuitry 125 to limit overvoltage or voltage spikes at the operational circuitry in the same or similar manner as described by example herein.

Figure 2:
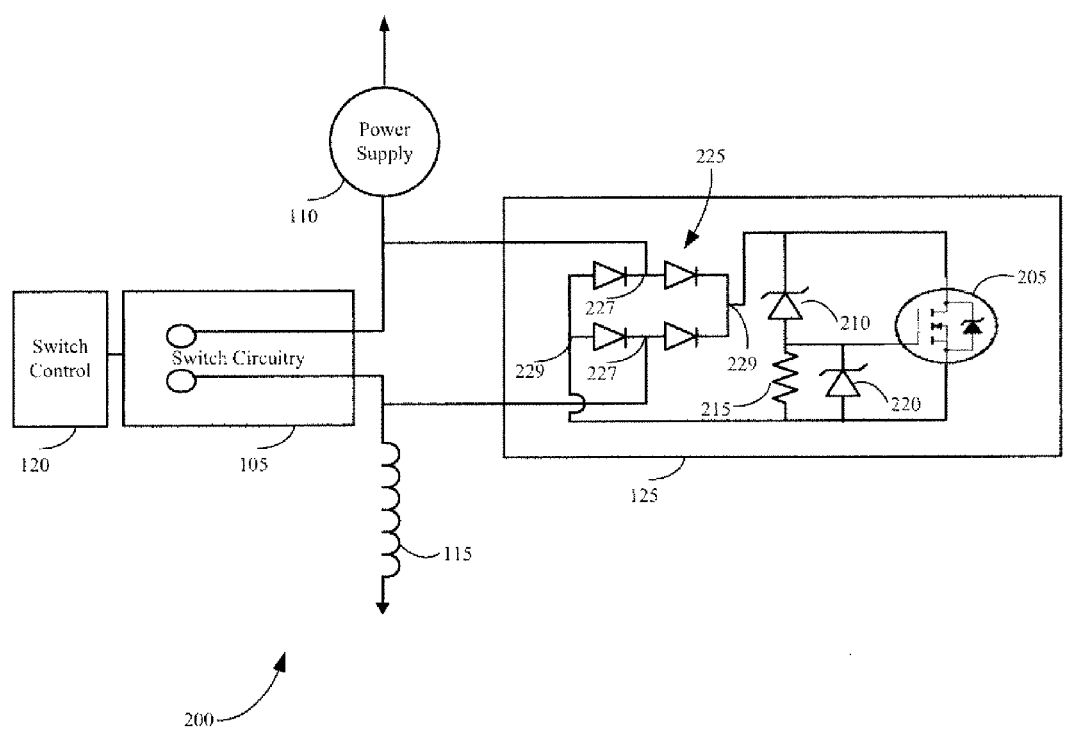
FIG. 2 is a schematic representation of switch circuitry and voltage clamping circuitry, according to one example embodiment.

FIG. 2 illustrates a schematic representation of circuitry 200 including switch circuitry and voltage clamping circuitry, according to one example embodiment. According to this embodiment, the voltage clamping circuitry 125 includes an electronic active switching device embodied as a MOSFET 205.

Figure 3:
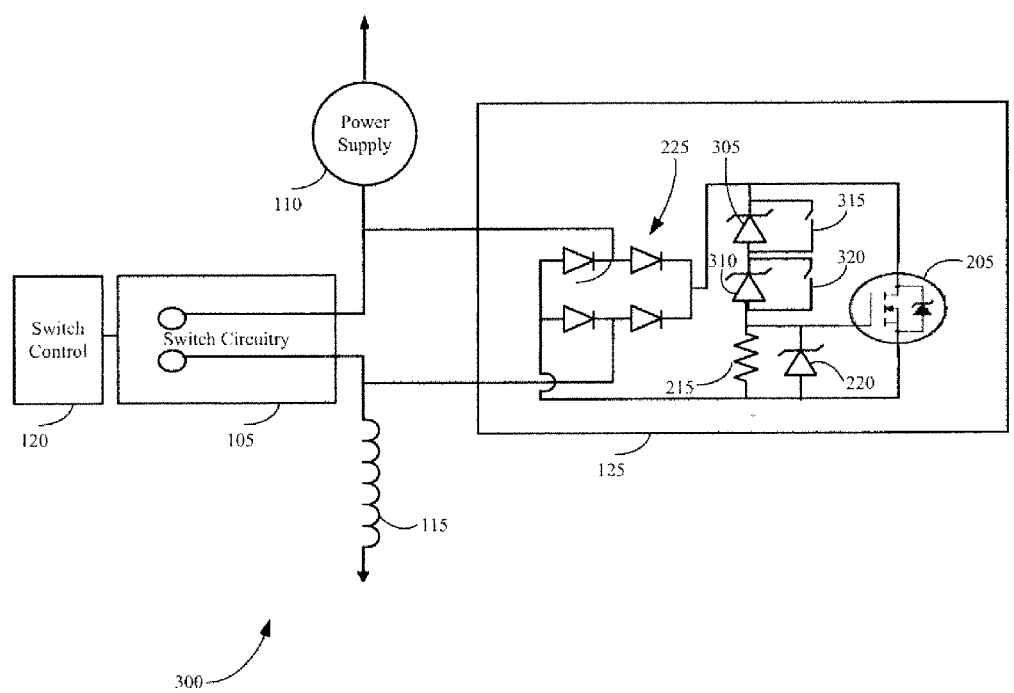
FIG. 3 is a schematic representation of switch circuitry and voltage clamping circuitry, according to one example embodiment.
Figure 4:
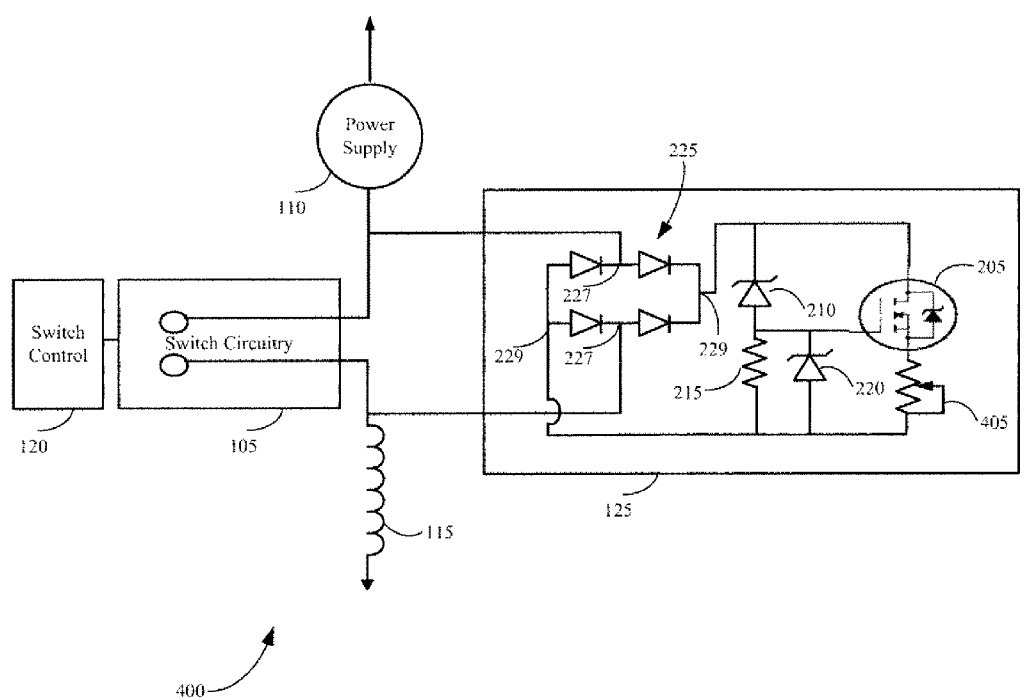
FIG. 4 is a schematic representation of switch circuitry and voltage clamping circuitry, according to one example embodiment.
Figure 5:
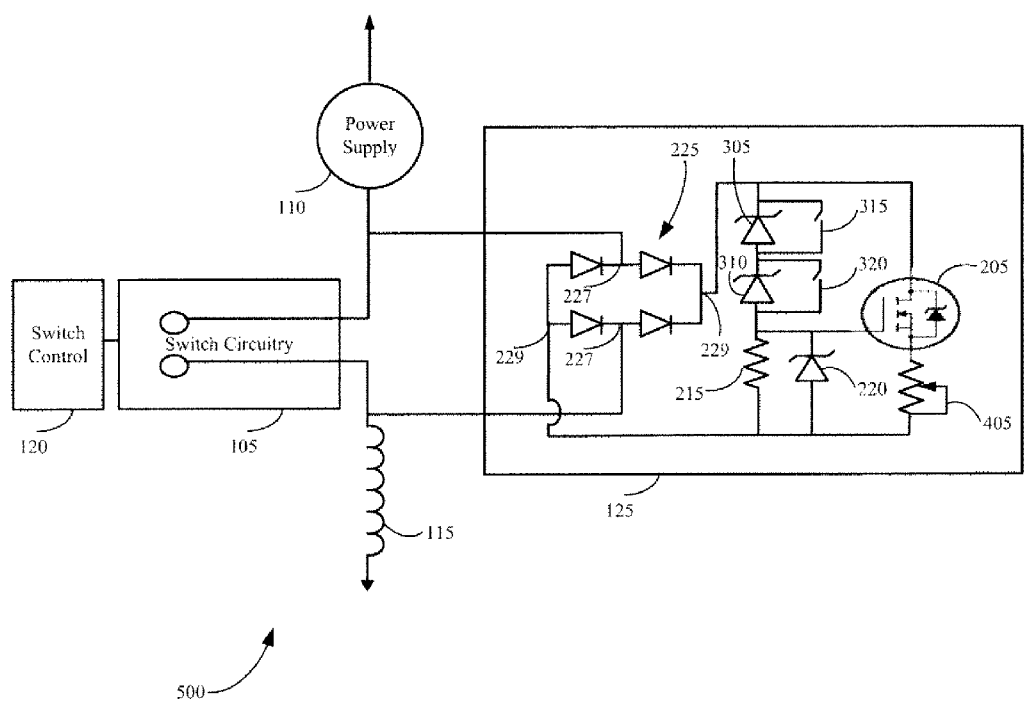
FIG. 5 is a schematic representation of switch circuitry and voltage clamping circuitry, according to one example embodiment.

In addition, the clamp detect and activate circuitry may include a first Zener diode 210 in communication with the MOSFET 205 across its gate and drain, and in communication with an output of the rectifier circuitry. The Zener voltage (or the breakdown voltage) of the first Zener diode 210 facilitates controlling the voltage at which point the MOSFET 205 will be activated (also referred to interchangeably herein as "activating voltage"). Accordingly, the first Zener diode 210 impacts the desired clamping voltage of the voltage clamping circuitry 125, which is also impacted by any voltage differences resulting from the rectifier circuitry and the MOSFET 205 threshold voltage (e.g., the gate-to-source threshold voltage). It is appreciated that the first Zener diode 210 is illustrated here for simplicity, but that, according to other embodiments, more than one diode may be provided and/or other diode or shunt components not limited to Zener diodes may be provided for the clamp detect and activate circuitry. For example, FIGS. 3-5 illustrate various other circuitry configurations that may be applied instead of a single first Zener diode 210.

Also illustrated in this embodiment are a first resistor 215 and a second Zener diode 220 in parallel communication across the MOSFET 205 gate and source. The second Zener diode 220 is selected to protect the MOSFET 205 from exceeding the maximum gate-to-source voltage. The first resistor 215 is selected to provide any necessary bias or gate voltage to the MOSFET 205 gate, which is generally dictated by the MOSFET 205 design.

The rectifier circuitry according to this embodiment includes a diode bridge rectifier circuit 225 capable of rectifying AC to DC. Accordingly, the diode bridge rectifier circuitry 225 includes inputs 227 and outputs 229. The inputs are in parallel communication with the switch circuitry 105, which is operable to switch the current delivered from the power supply 110 to the inductive load 115. In addition, due to the configuration of the diode bridge rectifier circuit 225, the clamping circuitry is capable of handling AC current independent of the direction of the current. It is appreciated that, according to some embodiments, the rectifier circuitry may differ from that illustrated herein by example. For example, in an embodiment in which the power supply 110 is a DC power supply, the rectifier circuitry may differ from that illustrated by FIG. 2, or may not be included at all, because it will not need to rectify the voltages.

In addition, the voltage clamping circuitry 125 operates independent of the switch circuitry 105, with the diode bridge rectifier circuit 225 Zener voltages and the first Zener diode 210 Zener voltages influencing the activation of the remainder of the voltage clamping circuitry 125. To select the values of the voltage clamping circuitry 125 components, the Zener voltage of the first Zener diode 210 is to be greater than the operating or working voltage of the operational circuitry controlled by the switch circuitry 105. The MOSFET 205 values, or any other electronic active switching circuitry values, shall be selected based on the behavior of the inductive load 115 as well as the operating or working voltage of the circuitry controlled by the switch circuitry 105. The MOSFET 205 (or any other electronic active switching circuitry) is selected to have a safe operating area that accommodates the anticipated large energy dissipation. It is appreciated that selection of these actual values will depend upon the circumstance in which the switch circuitry 105 and the voltage clamping circuitry 125 are to be provided, and that the scope of the claims is not dependent upon circuitry component values.

Accordingly, an illustrative operation of the circuitry 200 illustrated with reference to FIG. 2 will now described. The switch circuitry 105 is operable to switch on and off the power supply 110 to the inductive load 115. In one example, a switch control 120 may be utilized to control the switch circuitry 105. When the switch circuitry 105 is opened, current does not flow from the power supply 110 to the inductive load 115. However, when the switch circuitry 105 is opened, energy will be generated by the inductive load 115 causing a voltage across the switch circuitry 105. For example, the point in the switch circuitry 105 that is connected to neutral AC or DC ground will go negative with respect to the opposite point connected to ground. Accordingly, voltage across switch circuitry 105 (these two points) will increase to the DC voltage plus the voltage generated by the inductive load 115. It is possible that this increase in voltage may exceed the maximum voltage rating of the switch circuitry 105, also referred to interchangeably herein as a "voltage spike" or an "overvoltage." Thus, the voltage clamping circuitry 125 described above serves to protect any overvoltage or voltage spike at the switch circuitry 105 (or at any other point in operational circuitry).

In an embodiment in which the power supply 110 is an AC power supply, the diode bridge rectifier circuit 225, converts the AC overvoltage generating across the switch circuitry 105 (and likewise across the inputs 227 of the diode bridge rectifier circuit 225) to DC. As the overvoltage generating across the switch circuitry 105 increases across the diode bridge rectifier circuit 225 it will reach a certain voltage level that will activate the MOSFET 205. That activating voltage level is dependent upon any voltage drop across the diode bridge rectifier circuit 225, the Zener voltage of the first Zener diode 210, and the gate-to-source voltage threshold of the MOSFET 205, according to this embodiment. At this activating voltage level, the MOSFET 205 will activate and current will flow therethrough. While the MOSFET 205 (or any other electronic active switching device) is active, the current flows from the power supply 110, through the clamping circuitry (through the MOSFET 205), and then through the inductive load 115 to ground. Accordingly, the clamping voltage (Vclamp1), which refers to the voltage limit provided by the voltage clamping circuitry 125, is dependent upon the design and values of the rectifier circuitry if provided, the design and values of the first Zener diode 210 (or diodes), and the design and values of the MOSFET 205.

As an illustrative example, switch circuitry 105 with a maximum operating voltage of 200 volts can be provided for use with circuitry having a nominal operating voltage of 125 volts. If the first Zener diode 210 has a Zener voltage of approximately 160 volts, and the gate-to-source voltage threshold of the MOSFET 205 is about 4 volts, then the clamping voltage will be at or near 164 volts (plus any additional voltage drop caused by the diode bridge rectifier circuit 225, if utilized). It is appreciated that the aforementioned values are provided for illustrative purposes only, and are not intended to be limiting. Any component design and values may be selected as desired, which may depend in part on the power supply, the load, the switch circuitry, and/or any other operational circuitry or loads to which the voltage clamping circuitry 125 is applied.

FIG. 3 illustrates a schematic representation of circuitry 300 including switch circuitry and voltage clamping circuitry, according to another example embodiment. According to this embodiment, the voltage clamping circuitry 125 also includes an electronic active switching device embodied as a MOSFET 205 and a diode bridge rectifier circuit 225, as described with reference to FIG. 2 (although, it is appreciated that the features described with reference to FIG. 3 may likewise be applied to any other embodiment described herein). However, according to this embodiment, the clamp detect and activate circuitry includes at least two Zener diodes 305, 310 in series communication and connected across the gate and drain of the MOSFET 205. In addition, a switch 315, 320 is in parallel communication with each Zener diode 305, 310, respectively.

By including the Zener diodes 305, 310 in series, the voltage clamping voltage of the clamping circuit 125, which activates the MOSFET 205 (or other electronic active switching device), can be adjusted by adjusting the Zener voltage values of the Zener diodes 305, 310. Due to their series relationship, the Zener voltages of the Zener diodes 305, 310 are added together to influence the activating voltage to activate the MOSFET 205 and, thus, the clamping voltage of the voltage clamping circuitry 125.

By including a switch 315, 320 in parallel with a respective Zener diode 305, 310, the additive effect of the respective Zener voltage can be controlled. For example, in the case of two diodes 305, 310 and two switches 315, 320 the following states may be provided. In a first state, both switches 315, 320 are open and will cause current to flow through both Zener diodes 305, 310, causing the additive effect of the Zener voltages for both diodes to contribute to the clamping voltage such that the MOSFET 205 will not be activated unless at least the sum of the Zener voltages for both diodes is reached. In a second state, the first switch 315 is open and the second switch 320 is closed, which will cause current to flow through the first Zener diode 305 but through the second switch 320 instead of the second Zener diode 310, which in turn results in the clamping voltage to be dependent only on the Zener voltage of the first Zener diode 305. Similarly, in a third state, with only the second switch 320 open, the clamping voltage will only be dependent upon the second Zener diode 310. In the fourth state, with both switches 315, 320 closed, the clamping voltage does not depend upon the Zener diodes 305, 310 at all because current will instead flow through both switches to the gate of the MOSFET 205. In this fourth state, the clamping voltage depends on the gate-to-source threshold voltage and any drop at the diode bridge rectifier circuit 225.

Accordingly, the Zener diodes 305, 310 values can be selected such that selective operation of the respective switches 315, 320 will cause the desired change in the clamping voltage of the voltage clamping circuit 125. It is appreciated that these Zener voltage values may be the same or different Zener voltages, as desired. Moreover, it is further appreciated that, while FIG. 3 illustrates two Zener diodes 305, 310 and switches 315, 320, any number of components can be utilized to allow for more sensitive and/or a wider selection of the clamping voltages, as desired.

According to various embodiments, the switches 315, 320 may be manually operated (e.g., mechanical switches), electronic switches, or electromechanical switches. For example, electronic or electromechanical switches 315, 320 may be controlled by a computer processor-based device, incorporating operating logic that may, in some embodiments, utilize user settings or commands, environmental conditions, and/or circuit conditions to selectively control the switches 315, 320.

FIG. 4 illustrates a schematic representation of circuitry 400 including switch circuitry and voltage clamping circuitry, according to another example embodiment. According to this embodiment, the voltage clamping circuitry 125 also includes an electronic active switching device embodied as a MOSFET 205 and a diode bridge rectifier circuit 225, as described with reference to FIG. 2 (although, it is appreciated that the features described with reference to FIG. 4 may likewise be applied to any other embodiment described herein). However, according to this embodiment, an additional variable resistive device 405 is in communication with an output of the diode bridge rectifier circuit 225 and the source of the MOSFET 205.

This additional variable resistive device 405 may be, but is not limited to, a varistor, a potentiometer, and the like. However, in some embodiments, instead of a variable resistive device, a fixed resistor may be provided. The additional resistance created by the variable resistive device 405 operates to limit current flowing through the voltage clamping circuit 125 to the MOSFET 205 (or any other electronic active switching device). For example, when an overvoltage exceeds the Zener voltage of the first Zener diode 210, current will flow through the variable resistive device 405 (or any other resistor). Voltage will increase until approximately the sum of the Zener voltage of the first Zener diode 210 and the Zener voltage of the second Zener diode 220. When the current through the variable resistive device 405 reaches its threshold, the voltage drop across the variable resistive device 405 and the gate-to-source threshold voltage of the MOSFET 205 reaches the Zener voltage of the second Zener diode 220, which results in the current through the voltage clamping circuitry 125 reaching a maximum current level. If the current attempts to increase beyond that maximum level, the MOSFET 205 does not achieve the sufficient gate-to-source voltage threshold and attempts to deactivate or switch off. At the time of attempted deactivation, the current through the variable resistive device 405 is reduced, and the voltage clamping behavior continues while the current levels are controlled.

In an embodiment in which a fixed resistor is utilized instead of the variable resistive device 405, the current protection limit will be fixed based on the fixed resistance, the gate-to-source voltage threshold of the MOSFET 205, and the Zener voltage of the second Zener diode 220. However, by using a variable resistive device 405 (such as, but not limited to a potentiometer), the current protection levels can be adjusted, assuming the variable resistive device 405 can withstand the power levels experienced in the voltage clamping circuitry 125. Like the switches described with reference to FIG. 3, the variable resistive device 405 may be manually controlled (e.g., mechanically), or may be electronically controlled, such as by a computer processor-based device, incorporating operating logic that may, in some embodiments, utilize user settings or commands, environmental commands, and/or circuit conditions to control the resistance.

FIG. 5 illustrates a schematic representation of circuitry 500 including switch circuitry and voltage clamping circuitry, according to another example embodiment. According to this embodiment, the voltage clamping circuitry 125 includes both a series of Zener diodes 305, 310 and parallel switches 315, 320, as described with reference to FIG. 3, in addition to a variable resistive device 405, as described with reference to FIG. 4, allowing for adjustable clamping voltage and adjustable current protection limits.

Figure 6:
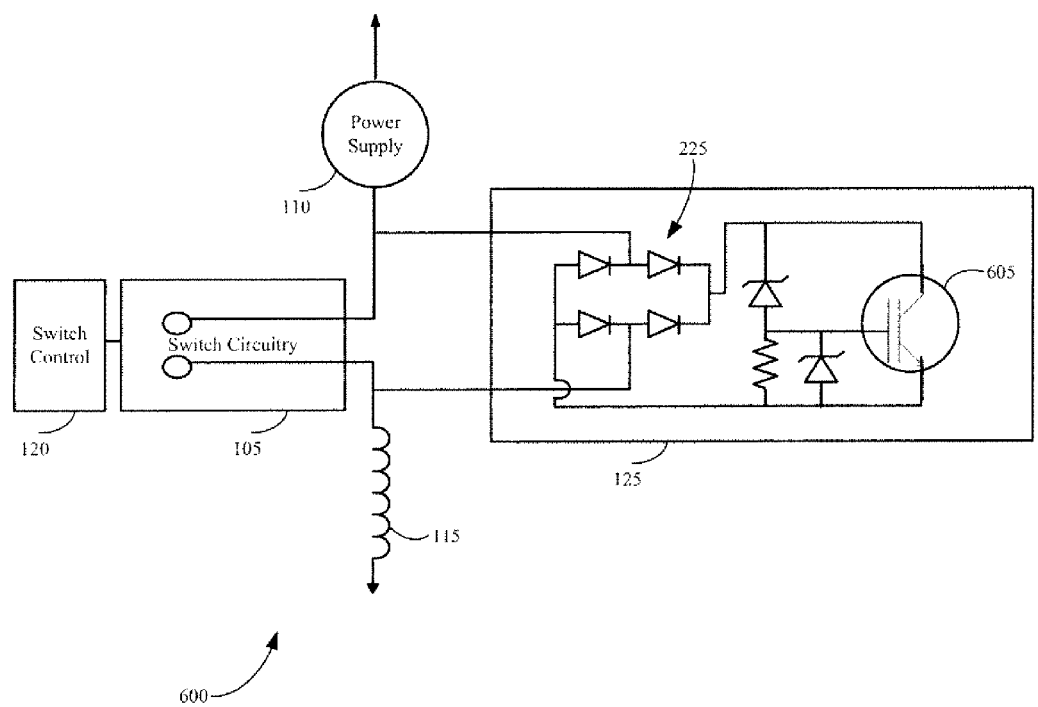
FIG. 6 is a schematic representation of switch circuitry and voltage clamping circuitry, according to one example embodiment.

FIG. 6 illustrates a schematic representation of circuitry 600 including switch circuitry and voltage clamping circuitry, according to another example embodiment. According to this embodiment, the voltage clamping circuitry 125 includes an electronic active switching device embodied as an insulated gate bipolar transistor (IGBT) device 605. According to this embodiment, the rectifier circuitry and the clamp detect and activate circuitry may be provided as described with reference to other embodiments herein. In addition, adjustable clamping voltage circuitry, such as is described with reference to FIG. 3, and/or adjustable current protection circuitry, such as is described with reference to FIG. 4, may optionally be included.

Figure 7:
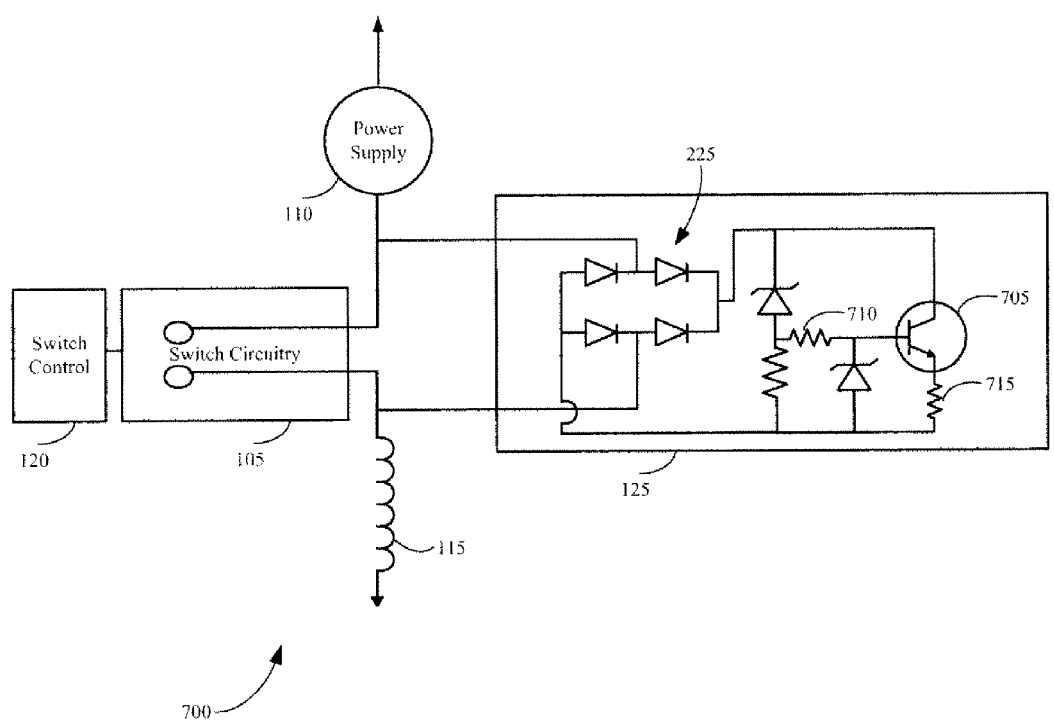
FIG. 7 is a schematic representation of switch circuitry and voltage clamping circuitry, according to one example embodiment.

FIG. 7 illustrates a schematic representation of circuitry 700 including switch circuitry and voltage clamping circuitry, according to another example embodiment. According to this embodiment, the voltage clamping circuitry 125 includes an electronic active switching device embodied as a bipolar junction transistor (BJT) device 705. In addition to the previously described rectifier circuitry and clamp detect and activate circuitry, one or more additional resistors in series with the BJT device 705 may be provided to limit current flowing through the base and/or emitter. For example, according to this embodiment, at least one second resistor 710 is provided in series with the base and at least one third resistor 715 is provided in series with the emitter. The selection of resistance values and/or components to provide the second resistor 710 and the third resistor 715 will depend upon the circumstance in which the switch circuitry 105 and the voltage clamping circuitry 125 are to be provided. It is further appreciated that adjustable clamping voltage circuitry, such as is described with reference to FIG. 3, and/or adjustable current protection circuitry, such as is described with reference to FIG. 4, may optionally be included with the BJT device 705.

Figure 8:
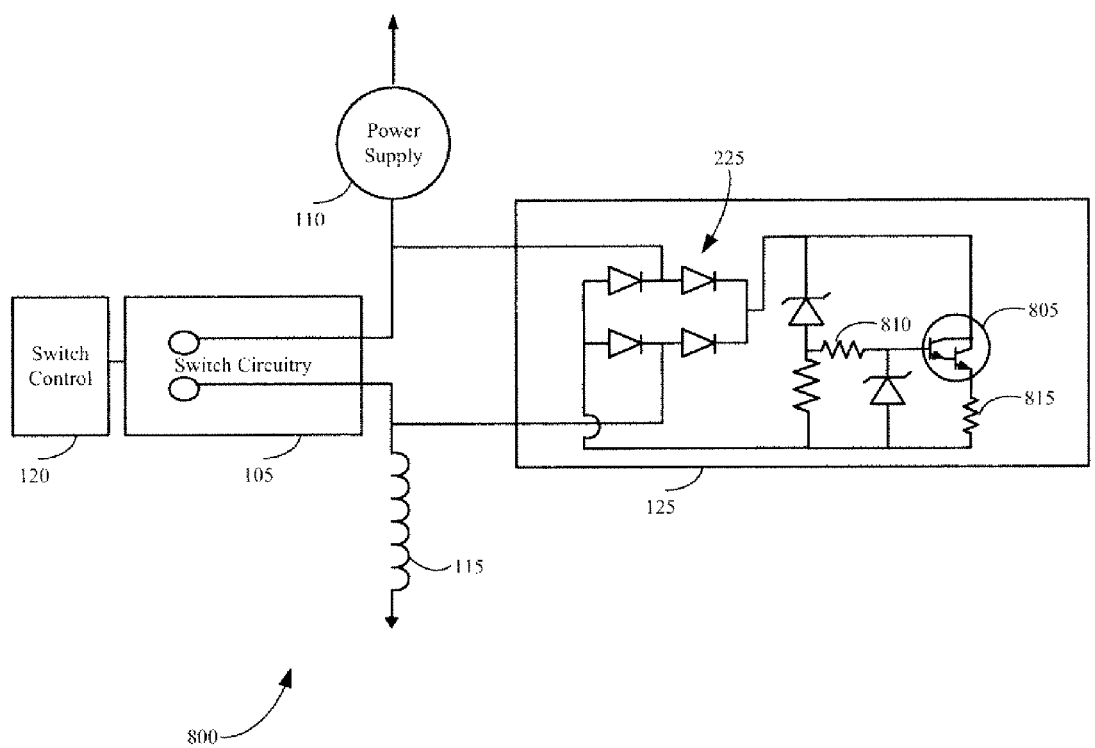
FIG. 8 is a schematic representation of switch circuitry and voltage clamping circuitry, according to one example embodiment.

FIG. 8 illustrates a schematic representation of circuitry 800 including switch circuitry and voltage clamping circuitry, according to another example embodiment. According to this embodiment, the voltage clamping circuitry 125 includes an electronic active switching device embodied as Darlington pair transistor device 805. Like the BJT device described with reference to FIG. 7, the Darlington pair transistor device 805 may further include one or more additional resistors in series communication to limit current flowing through the base and/or emitter. For example, according to this embodiment, at least one second resistor 810 is provided in series with the base and at least one third resistor 815 is provided in series with the emitter. The selection of resistance values and/or components to provide the second resistor 810 and the third resistor 815 will depend upon the circumstance in which the switch circuitry 105 and the voltage clamping circuitry 125 are to be provided. It is further appreciated that adjustable clamping voltage circuitry, such as is described with reference to FIG. 3, and/or adjustable current protection circuitry, such as is described with reference to FIG. 4, may optionally be included with the Darlington pair transistor device 805.

It is appreciated that the systems and corresponding circuit configurations illustrated and described with reference to FIGS. 1-8 are provided for illustrative purposes only, and that many other systems, circuit configurations, and/or number of system components can be provided in a like manner. For example, in addition to limiting voltage across switch circuitry operable for switching inductive loads, the clamping circuitry embodiments described herein may likewise be utilized as transient suppressor circuitry to limit voltage spikes or overvoltages rapidly to other operational circuitry and/or when the corresponding transient energy is limited. It is appreciated that other uses of the voltage clamping circuitry described herein that are not necessarily utilized for switch protection, but instead for other operational circuitry or electronics, will be apparent by the foregoing description.

Accordingly, various embodiments described herein provide voltage clamping circuitry that includes an electronic active switching device, clamp detect and activate circuitry, and optionally rectifier circuitry to rectify AC current and handle bi-directional current. These embodiments provide the technical effects of limiting voltage spikes or overvoltages by the selection and design of the electronic active switching device and clamp detect and activate circuitry. Additional technical effects can be achieved, such as achieving selective or adjustable clamping voltage utilizing multiple diodes and switch pairs, as well as achieving selective or adjustable current limit protection utilizing adjustable resistive devices (or fixed resistors).

Many modifications and other embodiments of the exemplary descriptions set forth herein to which these descriptions pertain will come to mind having the benefit of the teachings presented in the foregoing descriptions and the associated drawings. Thus, it will be appreciated that the invention may be embodied in many forms and should not be limited to the exemplary embodiments described above. Therefore, it is to be understood that the invention is not to be limited to the specific embodiments disclosed and that the modifications and other embodiments are intended to be included within the scope of the appended claims. Although specific terms are employed herein, they are used in a generic and descriptive sense only and not for purposes of limitation.

The claimed invention is:

1. A voltage clamping circuit, comprising:
switching circuitry operable to selectively decouple a power supply from an inductive load; and
a full-wave bridge rectifier circuit having an AC input side coupled to the switching circuitry and a DC output side coupled to a parallel circuit configuration comprising a switching device and a voltage clamping circuit, the voltage clamping circuit comprising a first Zener diode having a first Zener voltage selected to provide a voltage clamping condition when the switching circuitry is operated.

2. The circuit of claim 1, wherein the switching device comprises a metal-oxide-semiconductor field-effect transistor (MOSFET).

3. The circuit of claim 2, wherein the first Zener diode is coupled across a drain and a gate of the MOSFET.

4. The circuit of claim 3, further comprising:
at least one protection Zener diode coupled across the gate and a source of the MOSFET, the at least one protection Zener diode operable to limit voltage across the gate and the source of the MOSFET.

5. The circuit of claim 2, wherein the voltage clamping condition comprises a Vclamp voltage that is dependent upon the sum of the first Zener voltage of the first Zener diode and a gate to source voltage of the MOSFET.

6. The circuit of claim 1, wherein the voltage clamping condition comprises a Vclamp voltage that is dependent upon the sum of the first Zener voltage of the first Zener diode and a breakdown voltage limit of the switching device.

7. The circuit of claim 6, further comprising a second Zener diode connected in series with the first Zener diode.

8. The circuit of claim 7, further comprising two switches, each of the two switches connected in parallel with a respective one of the first and the second Zener diode.

9. The circuit of claim 8, wherein each of the first and the second Zener diode has a respective Zener voltage contributing to the Vclamp voltage, and wherein opening each of the two switches increases the Vclamp voltage by the Zener voltage of the respective first or the second Zener diode.

10. The circuit of claim 1, further comprising at least one resistor connected in series with the switching device to limit a current flowing through the switching device.

11. The circuit of claim 10, wherein the at least one resistor comprises at least one variable resistor.

12. The circuit of claim 1, wherein the switching device comprises a bipolar junction transistor.

13. The circuit of claim 1, wherein the switching device comprises a Darlington pair transistor.

14. The circuit of claim 1, wherein the switching device comprises an insulated gate bipolar transistor.

15. The circuit of claim 1, wherein the full-wave bridge rectifier provides full-wave voltage rectification for bi-directional voltage clamping.

16. A method for providing voltage clamping during transients, comprising:
activating a switch to one of: a) couple a power supply to an inductive load or b) decouple the power supply from the inductive load;
using a full-wave bridge rectifier to convert an AC voltage transient into a DC voltage, wherein the AC voltage transient is developed across the switch when the switch is activated; and
coupling the DC voltage into a voltage clamping circuit, the voltage clamping circuit comprising a first Zener diode connected across a gate and a drain of a switching field-effect transistor; a second Zener diode connected across the gate and a source of the field-effect transistor; and a resistor connected across the gate and the source of the field-effect transistor.

17. The method of claim 16, wherein the voltage clamping circuit further comprises at least one resistor connected in series with the switching field-effect transistor, and further comprising:
adjusting the current flowing between the drain and the source of the switching field-effect transistor by altering the resistance of the at least one resistor.

18. A voltage clamping circuit, comprising:
a switch operable to one of: a) couple a power supply to an inductive load or b) decouple the power supply from the inductive load;
a full-wave bridge rectifier having an AC input side connected across the switch, the full-wave bridge rectifier configured to rectify an AC voltage transient into a DC voltage, wherein the AC voltage transient is developed across the switch when the switch is operated; and
a voltage clamping circuit coupled to a DC output side of the full-wave bridge rectifier, the voltage clamping circuit comprising a first Zener diode connected across a gate and a drain of a switching field-effect transistor; a second Zener diode connected across the gate and a source of the field-effect transistor; and a resistor connected across the gate and the source of the field-effect transistor.

19. The circuit of claim 1, wherein the switching device is the field-effect transistor.

20. The circuit of claim 19, wherein the full-wave bridge rectifier having the AC input side connected across the switch comprises:
a first junction of two diodes located on the AC input side of the full-wave bridge rectifier connected to one side of the switch and to the power supply; and
a second junction of two other diodes located on the AC input side of the full-wave bridge rectifier connected to another side of the switch and to the inductive load.

21. The circuit of claim 20, wherein a third junction of two diodes located on the DC output side of the full-wave bridge rectifier is connected to a drain of the field-effect transistor and a fourth junction of two other diodes located on the DC output side of the full-wave bridge rectifier is connected to a source of the field-effect transistor.

* * * * *